United States Patent
You et al.

(10) Patent No.: US 11,143,549 B2
(45) Date of Patent: Oct. 12, 2021

(54) ELECTRONIC PACKAGING STRUCTURE AND METHOD FOR MANUFACTURING THE ELECTRONIC PACKAGING STRUCTURE WITH OPTICAL GUIDE DIE SEPARATE FROM ELECTRONIC PACKAGE AND PHOTONIC DIE

(71) Applicant: Siliconware Precision Industries Co., Ltd., Taichung (TW)

(72) Inventors: Jin-Wei You, Taichung (TW); Cheng-Kai Chang, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 61 days.

(21) Appl. No.: 16/585,409

(22) Filed: Sep. 27, 2019

(65) Prior Publication Data
US 2021/0018360 A1 Jan. 21, 2021

(30) Foreign Application Priority Data
Jul. 15, 2019 (TW) .................................. 108124911

(51) Int. Cl.
*H01L 25/16* (2006.01)
*G01J 1/02* (2006.01)
*H04B 3/32* (2006.01)

(52) U.S. Cl.
CPC .............. *G01J 1/0204* (2013.01); *H04B 3/32* (2013.01)

(58) Field of Classification Search
CPC .............. G02B 6/12004; G02B 6/4295; G02B 6/4214; G02B 6/4292; G02B 6/4246; G02B 6/43; G02B 6/4202; G02F 1/2257; H01L 25/167; H01L 25/50; G01J 1/0204; G01J 1/0219
USPC ............................................... 250/214 R, 551
See application file for complete search history.

(56) References Cited

U.S. PATENT DOCUMENTS

| 9,341,786 B1* | 5/2016 | Gamache | ............. G02B 6/4246 |
| 10,606,003 B2* | 3/2020 | Peterson | ............. G02B 6/4292 |

* cited by examiner

*Primary Examiner* — Que Tan Le
(74) *Attorney, Agent, or Firm* — Mintz Levin Cohn Ferris Glovsky and Popeo, P.C.; Peter F. Corless; Steven M. Jensen

(57) ABSTRACT

The present disclosure provides an electronic packaging structure. A photonic die is disposed on an electronic package, and an optical guide die is not disposed on the electronic package. As the optical guide die malfunctions, only the optical guide die, rather than the whole electronic package and the photonic die, which may still function well, needs to be replaced. Therefore, the replacement cost is reduced, and the lifespan of the electronic packaging structure is increased. The present disclosure also provides a method for manufacturing the electronic packaging structure.

14 Claims, 5 Drawing Sheets

ELECTRONIC PACKAGING STRUCTURE AND METHOD FOR MANUFACTURING THE ELECTRONIC PACKAGING STRUCTURE WITH OPTICAL GUIDE DIE SEPARATE FROM ELECTRONIC PACKAGE AND PHOTONIC DIE

CROSS-REFERENCE TO RELATED APPLICATIONS

This application claims priority to Taiwanese Application Serial No. 108124911, filed on Jul. 15, 2019. The entirety of the application is hereby incorporated by reference herein and made a part of this specification.

BACKGROUND

1. Technical Field

The present disclosure relates to semiconductor packaging techniques, and, more particularly, to an electronic packaging structure and a method for manufacturing the same.

2. Description of the Prior Art

With the rapid development of electronic industry, electronic products have more functions and better performance. In order to meet the miniaturization package requirement for an electronic package, a wafer level packaging (WLP) technique come to the market.

FIGS. 1A to 1D are cross-sectional views illustrating a method for manufacturing a wafer level semiconductor package 1 according to the prior art.

As shown in FIG. 1A, a thermal release tape 11 is formed on a carrier 10.

Then, a plurality of communication dies 12 and 12' are disposed on the thermal release tape 11. Each of the communication dies 12 and 12' has an active surface 12a, on which a plurality of electrode pads 120 are disposed, and an inactive surface 12b opposing the active surface 12a. The active surfaces 12a of the communication dies 12 and 12' are adhered to the thermal release tape 11.

As shown in FIG. 1B, an encapsulant 13 is formed on the thermal release tape 11 via a molding method and encapsulates the communication dies 12 and 12'.

As shown in FIG. 1C, the encapsulant 13 is baked and cured, the thermal release tape 11 is heated concurrently and losses its adhesiveness, and the thermal release tape 11 and the carrier 10 are removed, to expose the active surfaces 12a of the communication dies 12 and 12'.

As shown in FIG. 1D, a redistribution layer (RDL) 14 is formed on the encapsulant 13 and the active surfaces 12a of the communication dies 12 and 12' and electrically connected to the electrode pads 120 disposed on the active surfaces 12a of the communication dies 12 and 12'.

Then, an insulation protection layer 15 is formed on the RDL 14, with a portion of the RDL 14 being exposed from the insulation protection layer 15, for a conductive element 16, such as a solder ball, to be bonded thereto.

In the method for manufacturing the semiconductor package 1 according to the prior art, the communication dies 12 and 12' are disposed in the same packaging structure. As the communication die 12 malfunctions, the whole semiconductor package 1 and the communication die 12', which may still function well, have to be discarded. Accordingly, the replacement cost at the user end is high.

With data network scaling to meet increasing demands of bandwidth, copper data channels (e.g., the circuits of the RDL 14) may have significant drawbacks, such as signal attenuation and signal crosstalk caused by the radiation electromagnetic energy between the communication dies 12 and 12'.

Although the balancing, encoding and shielding designs can ease the signal attenuation and signal crosstalk, these designs need great power, complexity, cable volume loss, and only improve the suitability and limited scalability in partial areas.

Therefore, how to overcome the drawbacks of the prior art is becoming an urgent issue in the art.

SUMMARY

In view of the drawbacks of the prior art, the present disclosure provides an electronic packaging structure, comprising: an electronic package; a photonic die disposed on and electrically connected to the electronic package; and an optical guide die communicatively connected to the electronic package and free from being disposed on the electronic package.

The present disclosure also provides a method for manufacturing an electronic packaging structure, comprising: providing an electronic package; disposing a photonic die on the electronic package and electrically connecting the photonic die to the electronic package; and communicatively connecting an optical guide die to the electronic package with the optical guide die free from being disposed on the electronic package.

In an embodiment, the electronic package is further disposed on an electronic device. In another embodiment, the optical guide die is electrically connected to and snapped on the electronic device. In yet another embodiment, the optical guide die is not disposed on the electronic device.

In an embodiment, at least one driver drives the photonic die.

In an embodiment, at least one transmission component is electrically connected to the photonic die.

In an embodiment, at least one driver drives the optical guide die.

In an embodiment, at least one transmission component is electrically connected to the optical guide die.

In an embodiment, the electronic package comprises at least one electronic component electrically connected to the photonic die and communicatively connected to the optical guide die.

In the electronic packaging structure and the method for manufacturing the same according to the present disclosure, the optical guide die is not disposed on the electronic package. As the optical guide die malfunctions, only the optical guide die, rather than the whole electronic package and the photonic die, which may still function well, needs to be replaced. Compared with the prior art, the electronic packaging structure according to the present disclosure reduces the replacement cost at user end and has increased lifespan.

With the transmission component as a transmission path, signal attenuation and signal crosstalk due to the radiation electromagnetic energy between the photonic dies and the optical guide dies are avoided, and the suitability and scalability of the electronic packaging structure are improved.

BRIEF DESCRIPTION OF THE DRAWINGS

FIG. 2E' is a partially enlarged view of FIG. 2E.

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "on," "first," "second," "a" and the like, are used to distinguish one element from another, and are not intended to limit the scope of the present application. Changes or adjustments are considered to be within the scope of the present disclosure, without departing from the scope of the present disclosure.

FIGS. 2A to 2E are cross-sectional views illustrating a method for manufacturing an electronic packaging structure 2 according to the present disclosure.

Figure 1A:
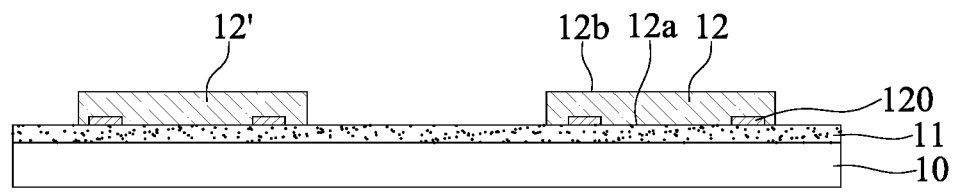
FIGS. 1A to 1D are cross-sectional views illustrating a method for manufacturing a wafer level semiconductor package according to the prior art.
Figure 1B:
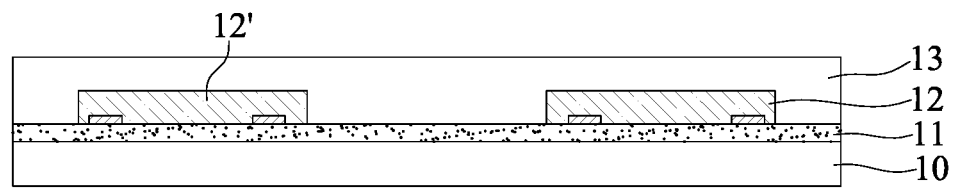
Figure 1C:
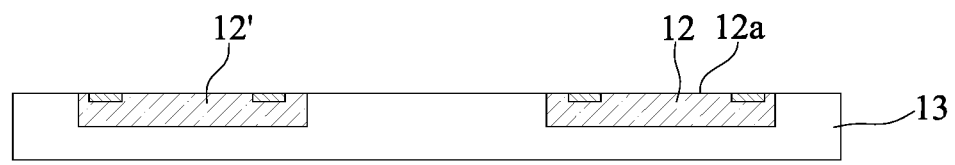
Figure 1D:
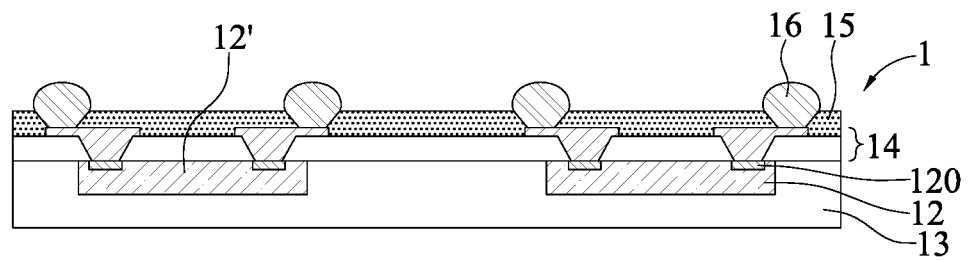
Figure 2A:
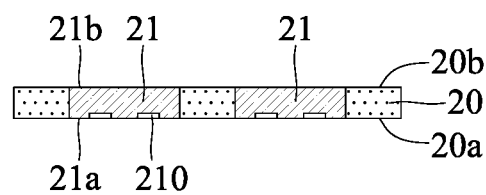
FIGS. 2A to 2E are cross-sectional views illustrating a method for manufacturing an electronic packaging structure of an embodiment according to the present disclosure.

As shown in FIG. 2A, an encapsulation body 20 having at least one electronic component 21 embedded therein is provided. The encapsulation body 20 has a first surface 20a and a second surface 20b opposing the first surface 20a.

In an embodiment, the encapsulation body 20 is an insulation material, such as polyimide (PI), a dry film, an encapsulant, such as epoxy, or a molding compound.

In an embodiment, the electronic component 21 is an active element, such as a semiconductor chip, a passive element, such as a resistor, a capacitor and an inductor, or a combination thereof. In an embodiment, the electronic component 21 is a semiconductor chip, such as an application-specific integrated circuit (ASIC) chip, and has an active surface 21a and an inactive surface 21b opposing the active surface 21a. A plurality of electrode pads 210 are disposed on the active surface 21a. The active surface 21a (or the electrode pads 210) is flush with and exposed from the first surface 20a of the encapsulation body 20. The inactive surface 21b is flush with and exposed from the second surface 20b of the encapsulation body 20.

Figure 2B:
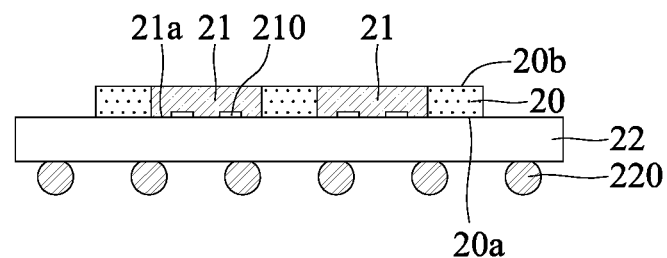

As shown in FIG. 2B, the first surface 20a of the encapsulation body 20 is disposed on an upper side of a first carrying structure 22, and the electrode pads 210 of the electronic component 21 are electrically connected to the first carrying structure 22.

In an embodiment, the first carrying structure 22 is a circuit structure having a core layer, a coreless circuit structure, a through silicon interposer (TSI) having through-silicon vias (TSVs), or other types of boards, and includes at least one insulation layer and at least one circuit layer (e.g., a fan out RDL) bonded to the insulation layer. In another embodiment, the first carrying structure 22 is a board that carries chips, such as a lead frame, a wafer, or other boards having metal routing. In yet another embodiment, the first carrying structure 22 is directly formed from the encapsulation body 20.

In an embodiment, the electrode pads 210 of the electronic component 21 are in direct contact with circuits of the first carrying structure 22. In another embodiment, the electrode pads 210 of the electronic component 21 are electrically connected to the circuits of the first carrying structure 22 in a flip-chip manner via a plurality of conductive bumps (not shown). In yet another embodiment, the electrode pads 210 of the electronic component 21 are electrically connected to the circuits of the first carrying structure 22 in a wire bonding manner via a plurality of bonding wires (not shown). In still another embodiment, the electronic component 21 can be electrically connected to the first carrying structure 22 in other manners.

A plurality of first conductive elements 220 are disposed on a lower side of the first carrying structure 22 (opposing the other side where the encapsulation body 20 is disposed). In an embodiment, the first conductive elements 220 are metal (e.g., copper) pillars, metal bumps covered with insulation blocks, solder balls, solder balls with Cu core balls, or other conductive structures.

Figure 2C:
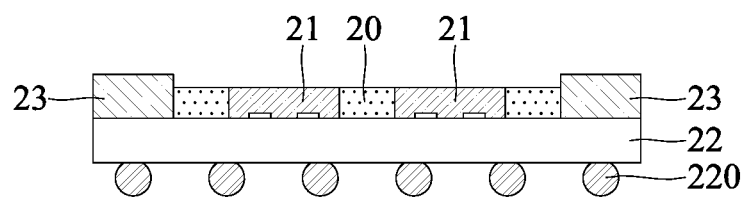

As shown in FIG. 2C, at least one photonic die 23 is disposed on the first carrying structure 22 and electrically connected to the first carrying structure 22.

In an embodiment, the photonic die 23 is in direct contact with the circuits of the first carrying structure 22. In another embodiment, the photonic die 23 is electrically connected to the circuits of the first carrying structure 22 in a flip-chip manner via a plurality of conductive bumps (not shown). In yet another embodiment, the photonic die 23 is electrically connected to the circuits of the first carrying structure 22 in a wire bonding manner via a plurality of bonding wires (not shown). In still another embodiment, the photonic die 23 can be electrically connected to the first carrying structure 22 in other manners.

Signals are transmitted between the photonic die 23 and the electronic component 21 via the first carrying structure 22.

Signals between the photonic dies 23 are transmitted via the first carrying structure 22.

Figure 2D:
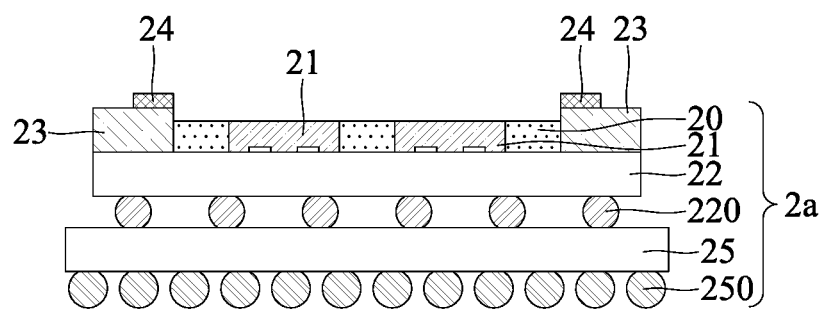

As shown in FIG. 2D, at least one driver 24 is disposed on the photonic die 23, and the first conductive elements 220 of the first carrying structure 22 are stacked on the upper side of the second carrying structure 25.

In an embodiment, the driver 24 drives the photonic die 23.

In an embodiment, the second carrying structure 25 is a packaging substrate with a circuit structure having a core layer or a coreless circuit structure, a through silicon interposer (TSI) having through-silicon vias (TSVs), or other types of boards, and includes at least one insulation layer and at least one circuit layer (e.g., a fan out RDL) bonded to the insulation layer. In another embodiment, the second carrying structure 25 is a board that carries chips, such as a lead frame, a wafer, or other boards having metal routing.

A plurality of second conductive elements 250 are disposed on a lower side of the second carrying structure 25 (opposing the other side where the first carrying structure 22 is disposed). In an embodiment, the second conductive elements 250 are metal (e.g., copper) pillars, metal bumps covered with insulation blocks, solder balls, solder balls with Cu core balls, or other conductive structures.

In an embodiment, the encapsulation body 20, the electronic component 21, the first carrying structure 22 and the second carrying structure 25 form an electronic package 2a.

In another embodiment, the electronic package 2a is a single carrying structure. The electronic package can have other types.

Figure 2E:
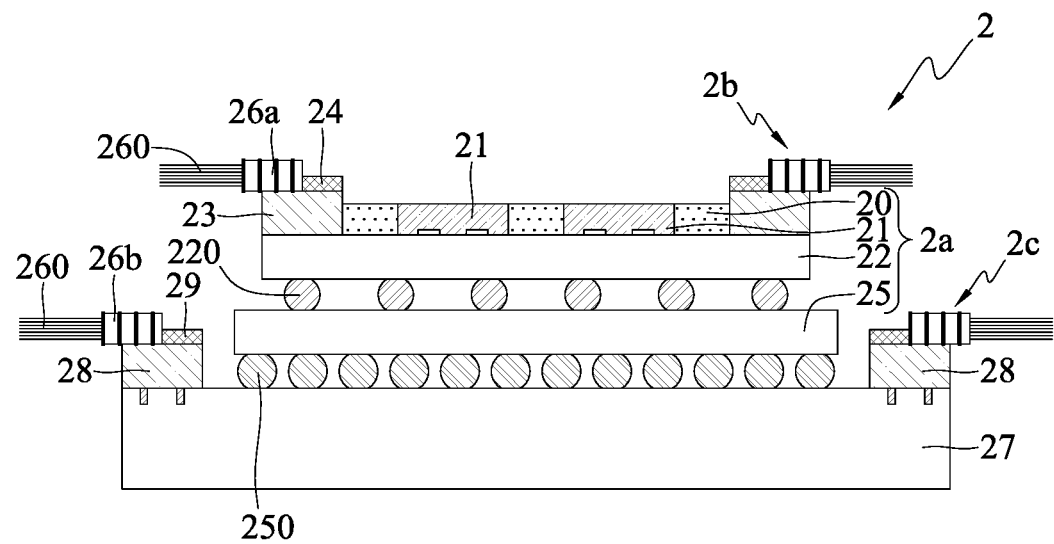
Figure 2E:
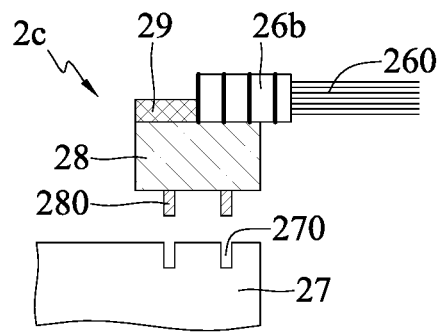

As shown in FIG. 2E, the second conductive elements 250 of the electronic package 2a are disposed on an electronic device 27, such as a circuit board or a mother board, and at least one optical guide die 28 is disposed on the electronic device 27 and electrically connected to the electronic component 21. In the electronic packaging structure 2 according to the present disclosure, the electronic packaging structure 2 has the electronic package 2a, the photonic die 23 and the optical guide die 28, which is not disposed on the first carrying structure 22 and the second carrying structure 25.

In an embodiment, at least one transmission component 26a is disposed on the photonic die 23. In another embodiment, the transmission component 26a is a bus, and has a set of bus wires 260 (e.g. optical fiber) to transmit signals.

The photonic die 23, the driver 24 and the transmission component 26a act as a first communication module 2b.

At least one first connection portion 270, such as a plug, is disposed on the electronic device 27, to expose contacts (not shown) of the electronic device 27.

In an embodiment, the optical guide die 28 is a laser die, and has on its bottom side at least one second connection portion 280 (e.g. pin) corresponding to the first connection portion 270. The second connection portion 280 is bonded to (e.g., plugged to) the first connection portion 270, allowing the optical guide die 28 to be detachably (e.g. plugably) fixed and electrically connected to the electronic device 27 (as shown in FIG. 2E'). In an embodiment, the optical guide die 28 is electrically connected to the contacts of the electronic device 27 in a flip-chip manner via a plurality of conductive bumps (not shown). In another embodiment, the optical guide die 28 is electrically connected to the contacts of the electronic device 27 in a wire bonding manner via a plurality of bonding wires (not shown). In yet another embodiment, the optical guide die 28 can be electrically connected to the electronic device 27 in other manners.

Another driver 29 and another transmission component 26b are disposed on the optical guide die 28 to form a second communication module 2c. The driver 29 drives the optical guide die 28. In an embodiment, the transmission component 26b is a bus, and has a set of bus wires 260 (e.g. optical fiber) to transmit signals.

Figure 3:
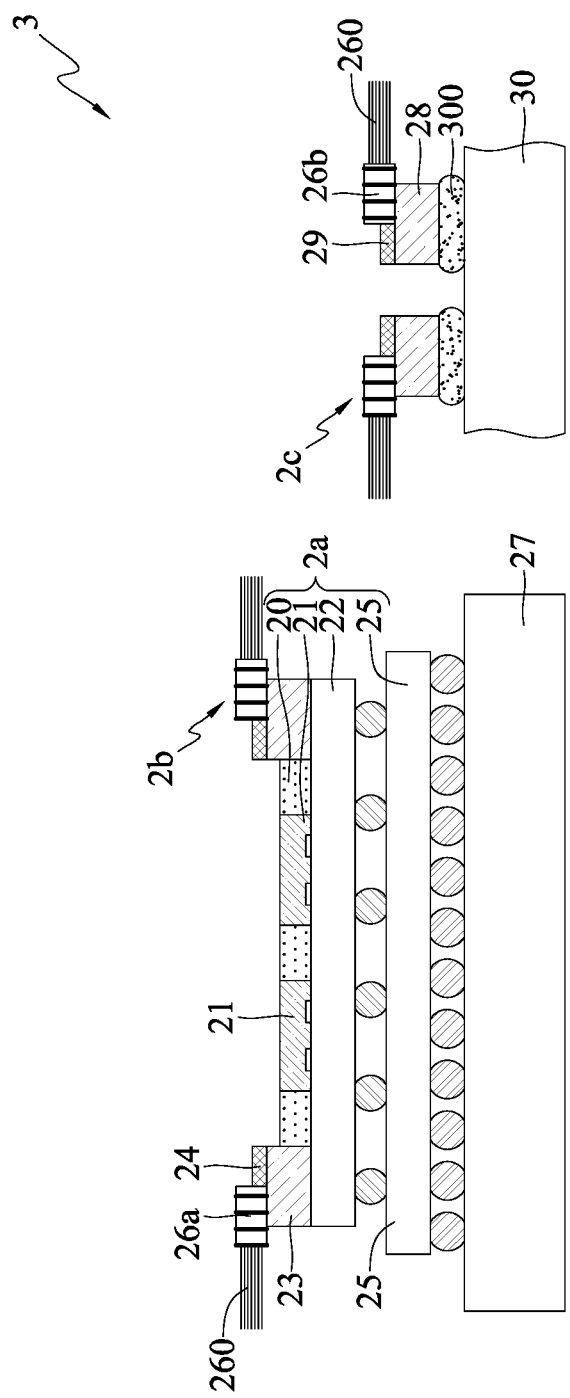
FIG. 3 is a schematic diagram of an electronic packaging structure of another embodiment according to the present disclosure.

In an embodiment, as shown in FIG. 3, the second communication module 2c is not disposed on the electronic device 27, but disposed on other areas of the electronic packaging structure 2, such as a housing 30 of an electronic product.

The optical guide die 28 can be fixed in many other manners. As shown in FIG. 3, the optical guide die 28 is adhered and fixed to the housing 30 (or the electronic device 27) via a bonding layer 300.

In the operation of the electronic packaging structure 2 according to the present disclosure, the electronic component 21 transmits signals to the optical guide die 28, and the optical guide die 28 converts the signals through a photoelectric signal conversion and transmits the converted signals via the transmission component 26b to an object. The photonic die 23 receives external signals via the transmission component 26a, converts the external signals through a photoelectric signal conversion and transmits the converted external signals to the electronic component 21.

In the method for manufacturing the electronic packaging structure 2 according to the present disclosure, the optical guide die 28 is not disposed on the electronic package 2a. As the optical guide die 28 malfunctions (e.g., light attenuation or broken down), only the optical guide die 28, rather than the whole electronic package 2a and the photonic die 23, which may still function well, needs to be replaced. Compared with the prior art, the electronic packaging structure 2 has reduced replacement cost at the user end and increased lifespan.

The bus wires 260 of the transmission components 26a and 26b act as a transmission path, to prevent the signal from being attenuated or crosstalked due to the radiation electromagnetic energy between the photonic dies 23 or the optical guide die 28. Therefore, the overall suitability and scalability of the electronic packaging structure 2 are improved.

Compared with the prior art, which employs balancing, encoding and shielding designs, the present disclosure does not consume great power, is not complex, and will not lose cable volume.

The present disclosure also provides an electronic packaging structure 2, 3, which comprises an electronic package 2a, at least one photonic die 23 and at least one optical guide die 28.

The photonic die 23 is disposed on the electronic package 2a and electrically connected to the electronic package 2a.

The optical guide die 28 is communicatively connected to the electronic package 2a, and is not disposed on the electronic package 2a.

In an embodiment, the electronic packaging structure 2, 3 further comprises an electronic device 27 provided with the electronic package 2a. In another embodiment, the optical guide die 28 is electrically connected to the electronic device 27, and the optical guide die 28 is snapped on the electronic device 27. In yet another embodiment, the optical guide die 28 is not disposed on the electronic device 27.

In an embodiment, the electronic packaging structure 2, 3 further comprises at least one driver 24 that drives the photonic die 23.

In an embodiment, the electronic packaging structure 2, 3 further comprises at least one transmission component 26a electrically connected to the photonic die 23.

In an embodiment, the electronic packaging structure 2, 3 further comprises at least one driver 29 that drives the optical guide die 28.

In an embodiment, the electronic packaging structure 2, 3 further comprises at least one transmission component 26b electrically connected to the optical guide die 28.

In an embodiment, the electronic package 2a comprises at least one electronic component 21 electrically connected to the photonic die 23 and communicatively connected to the optical guide die 28.

In the electronic packaging structure and the method for manufacturing the same according to the present disclosure, the optical guide die is not disposed on the electronic package. As the optical guide die malfunctions, only the optical guide die, rather than the whole electronic package and the photonic die, which may still function well, needs be replaced. Therefore, the replacement cost at the user end is reduced, and the lifespan of the electronic packaging structure is increased.

The foregoing descriptions of the detailed embodiments are only illustrated to disclose the features and functions of the present disclosure and are not restrictive of the scope of the present disclosure. It should be understood to those in the art that all modifications and variations according to the spirit and principle in the disclosure of the present disclosure should fall within the scope of the appended claims.

What is claimed is:

1. An electronic packaging structure, comprising:
   an electronic device;
   an electronic package disposed on the electronic device;
   a photonic die disposed on and electrically connected to the electronic package; and
   an optical guide die snapped on and electrically connected to the electronic device, wherein the optical guide die is communicatively connected to the electronic package and free from being disposed on the electronic package and the photonic die.

2. An electronic packaging structure, comprising:
   an electronic device;
   an electronic package disposed on the electronic device;
   a photonic die disposed on and electrically connected to the electronic package; and
   an optical guide die communicatively connected to the electronic package and free from being disposed on the electronic package and the photonic die, wherein the optical guide die is free from being disposed on the electronic device.

3. The electronic packaging structure of claim 1, further comprising a driver configured for driving the photonic die.

4. The electronic packaging structure of claim 1, further comprising a transmission component electrically connected to the photonic die.

5. The electronic packaging structure of claim 1, further comprising a driver configured for driving the optical guide die.

6. The electronic packaging structure of claim 1, further comprising a transmission component electrically connected to the optical guide die.

7. The electronic packaging structure of claim 1, wherein the electronic package comprises at least one electronic component electrically connected to the photonic die and communicatively connected to the optical guide die.

8. A method for manufacturing an electronic packaging structure, comprising:
   providing an electronic package;
   disposing the electronic package on an electronic device;
   disposing a photonic die on the electronic package and electrically connecting the photonic die to the electronic package; and
   communicatively connecting an optical guide die to the electronic package with the optical guide die free from being disposed on the electronic package and the photonic die, wherein the optical guide die is snapped on and electrically connected to the electronic device.

9. A method for manufacturing an electronic packaging structure, comprising:
   providing an electronic package;
   disposing the electronic package on an electronic device;
   disposing a photonic die on the electronic package and electrically connecting the photonic die to the electronic and
   communicatively connecting an optical guide die to the electronic package with the optical guide die free from being disposed on the electronic package and the photonic die, wherein the optical guide die is free from being disposed on the electronic device.

10. The method of claim 8, further comprising driving, by at least one driver, the photonic die.

11. The method of claim 8, further comprising electrically connecting at least one transmission component to the photonic die.

12. The method of claim 8, further comprising driving, by at least one driver, the optical guide die.

13. The method of claim 8, further comprising electrically connecting at least one transmission component to the optical guide die.

14. The method of claim 8, wherein the electronic package comprises at least one electronic component electrically connected to the photonic die and communicatively connected to the optical guide die.

* * * * *